United States Patent
Havens et al.

(10) Patent No.: US 6,342,804 B1
(45) Date of Patent: Jan. 29, 2002

(54) LOW-NOISE MIXER

(75) Inventors: Joseph Harold Havens, Tokyo (JP); Brian K. Horton, Sinking Spring, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/339,326

(22) Filed: Jun. 23, 1999

Related U.S. Application Data

(60) Provisional application No. 60/118,546, filed on Feb. 4, 1999.

(51) Int. Cl.[7] .................................................. G16F 7/44
(52) U.S. Cl. ........................ 327/357; 327/358; 327/359
(58) Field of Search ................................ 327/355, 356, 327/357, 358, 359, 360, 361, 105; 455/323, 333

(56) References Cited

U.S. PATENT DOCUMENTS

| | | | | |
|---|---|---|---|---|
| 5,329,189 A | * | 7/1994 | Ushida et al. ............... 327/355 |
| 5,379,457 A | * | 1/1995 | Nguyen ....................... 455/323 |
| 5,448,772 A | * | 9/1995 | Grandfield ................... 455/333 |
| 5,532,637 A | * | 7/1996 | Khoury et al. ............... 327/359 |
| 5,548,840 A | * | 8/1996 | Heck ........................... 455/326 |
| 5,589,791 A | * | 12/1996 | Gilbert ........................ 327/359 |
| 5,650,743 A | * | 7/1997 | Bien et al. ................... 327/359 |
| 5,826,182 A | * | 10/1998 | Gilbert ........................ 455/326 |
| 5,901,350 A | * | 5/1999 | Stoichita et al. ............ 455/333 |
| 6,157,822 A | * | 12/2000 | Bastani et al. .............. 455/323 |

* cited by examiner

Primary Examiner—Kenneth B. Wells
Assistant Examiner—Hai L. Nguyen
(74) Attorney, Agent, or Firm—Howard R. Popper

(57) ABSTRACT

A four-quadrant mixer is disclosed which has a low noise factor. The indeterminate common-mode voltage that may accompany the modulating signal is suppressed and replaced by a common-mode quiescent voltage designed to establish a predetermined quiescent biasing current through the mixer transistors common biasing resistors so that the mixer may be driven in common-mode by the modulating signal and differentially by the local oscillator signal. Advantageously, a larger value emitter biasing resistor can be used with the same value of emitter current that would obtain in a comparable four-quadrant Gilbert Mixer or, conversely, larger values of emitter current can be specified to establish a desired level of signal to noise ratio.

10 Claims, 3 Drawing Sheets

LOW-NOISE MIXER

This application claims the benefit of provisional application No. 60/118,546 filed Feb. 4, 1999.

FIELD OF THE INVENTION

This invention relates to mixer circuits and, more particularly, to mixer circuits operating under limited power supply voltage conditions.

BACKGROUND OF THE INVENTION

Recent advances in mobile radiotelephony have placed increasingly severe requirements on noise reduction. For example, the GSM standard, which has reduced the separation between adjacent channels to 10 MHz from 20 MHz, requires that the noise 20 MHz away from the carrier (or local oscillator) frequency be down by about 165 dBc/Hz to avoid injecting noise into the adjacent receive channel. One source of noise in radiotelephony arises from the biasing resistors used in the mixer circuitry. In the well-known Gilbert four-quadrant multiplier, for example, disclosed in Gray and Meyer's "Analysis and Design of Integrated Circuits", J. Wiley & Sons, NY, 3d ed., 1993 at p. 670, the mixer circuit includes two pairs of differentially driven, common emitter-connected transistors connected in series with a further pair of differentially driven, common-emitter connected transistors all of which are connected in series with the emitter biasing resistors across the collector voltage battery. Because sufficient voltage "head-room" must be available for the operation of the mixer only a small portion of the supply voltage remains from the emitters of these transistors to ground for the emitter biasing or linearizing resistor.

As explained, for example, in Gray and Meyer's text at pp. 715 et seq., of the various sources of circuit noise, thermal noise is a temperature dependent phenomenon that is present in any linear, passive resistor. The amount of thermal noise is independent of the amount of DC current passing through the resistor. Thus, for a given temperature, the signal to noise ratio in resistor is directly proportional to the magnitude of the signal current through the resistor. Conversely, for a given signal current, maximum signal to noise ratio is achieved by increasing the value of the resistor, thereby increasing the value of the signal voltage developed across the resistor. However where, as in the Gilbert multiplier, the emitter resistor is left with only a fraction of the collector battery voltage, an optimum signal to noise ratio cannot be achieved.

SUMMARY OF THE INVENTION

We have discovered that the signal to noise ratio of a four-quadrant mixer can be substantially increased by separately differentially driving the pairs of mixer transistors (B1–B4) and stabilizing their common-mode input voltages so that a desired value of current can be established in their common emitter biasing resistors that is independent of the common-mode voltage of the modulating signal source.

The four-quadrant mixer transistors are driven from the collectors of two pairs of local oscillator input buffer transistors (B5–B8) whose pairs of collector resistors are supplied from the common-mode stabilized outputs of an operational amplifier that supplies the differential modulating signal. In this way a larger value emitter biasing resistor can be used than would be possible in a typical Gilbert Mixer for the same value of emitter current or, conversely, larger values of emitter current can be specified to establish a desired level of signal to noise ratio.

A mixer thus configured has substantially low noise by (a) moving the dominate noise sources in front of an operational amplifier where the noise can be filtered and (b) reducing the noise contribution of the few components remaining after the output of the operational amplifier.

BRIEF DESCRIPTION OF THE DRAWING

The foregoing and other features of our invention may become more apparent from the ensuing description when read with the drawing, in which.

GENERAL DESCRIPTION

Figure 1:
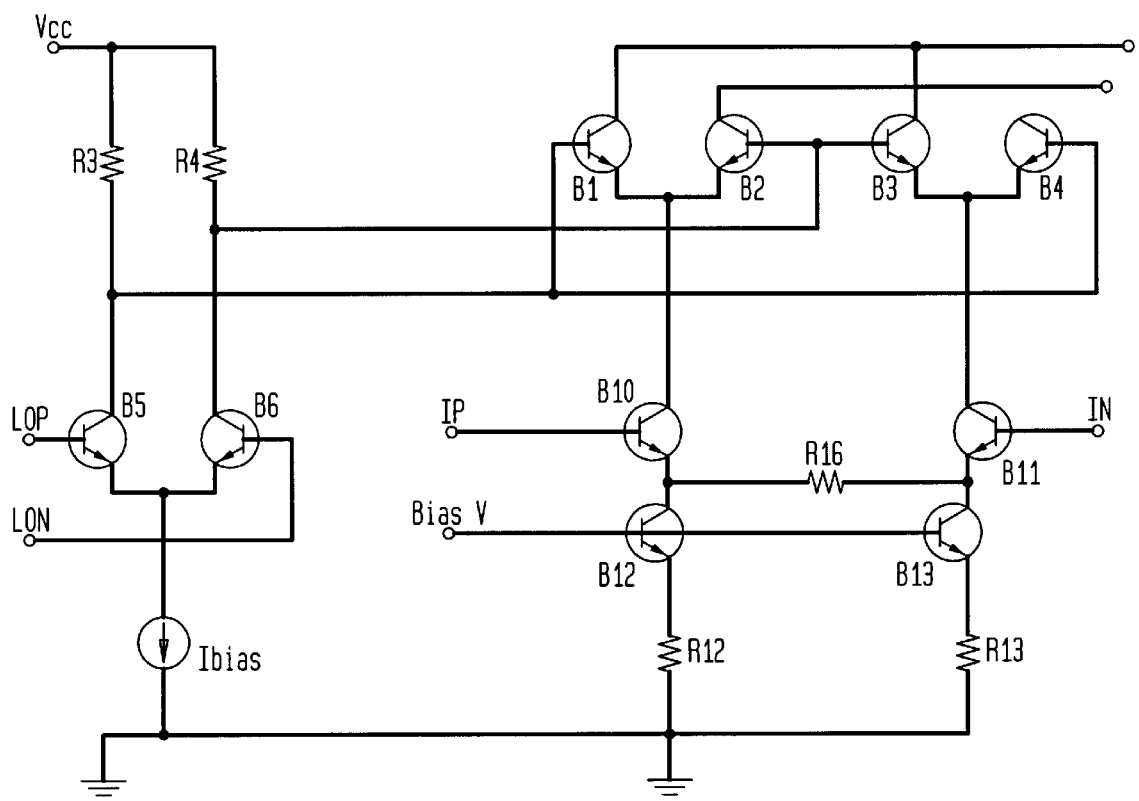
FIG. 1 is a prior art Gilbert multiplier circuit.

Referring now to FIG. 1, a prior art four-quadrant mixer is shown. The local oscillator source is connected between terminals LOP and LON of an input buffer stage comprising transistors B5, B6. Illustratively, such a source may provide a high frequency signal anywhere in the range from about 100 MHz to several gigaHertz. The differential voltage between the collectors of input buffer transistors B5, B6 and B7, B8 drives a first and second pair of common-emitter connected mixer transistors B1, B2 and B3, B4. The modulating signal, which for typical portable radiotelephone usage may be in the range of several hundred kilohertz, is applied to the bases of modulating transistors B10 and B11. Modulating transistors B10 and B11 are connected in the emitter paths of the first and second mixer transistor pairs, as is typical of the four-quadrant Gilbert mixer.

Because sufficient collector-emitter Vce voltage "headroom" must be available for the operation of mixer transistor pair B1, B2 as well as for this pair's modulating transistor B10, only a small portion of the total collector supply voltage Vcc is available for emitter biasing resistor R12. Similarly, sufficient collector-emitter voltage "head-room" Vce must be available for the operation of mixer transistor pair B3, B4 and its modulating transistor B1. Since resistor noise is a function primarily of temperature while signal strength is determined by signal voltage, the lower signal voltage that can be developed across the emitter biasing resistor due to headroom constraints results in the emitter currents through R12 and R13 having more noise than if the same emitter currents were produced in a larger value emitter biasing resistor.

The RMS noise current (in 1 Hz bandwidth) in a resistor equals sqrt(4 kT/R) where:

k—is Boltzman's constant, 1.38e-23 Watts/degree;

T—is temperature in degree Kelvin—say about 300 degrees for room temperature;

R—is the resistance in Ohms.

The current in the resistor is equal to V/R where V is the voltage across the resistor. The signal to noise ratio would be $(V/R)^2/(4\ kT/R)$ or more simply, $V^2/(4\ kTR)$. For example, if the head-room required for mixer transistors B1, B2 leaves 1V available from their emitter to ground and approximately 0.7V is required for transistor B10, only about 100 mV will be available across R12. If R12 is 330 ohms, a bias current of 300 uA results. A tenfold increase in signal to noise ratio would result if the same bias current could be effected in a circuit by replacing B10–B13 and R12, R13 with two resistors each having a value of 3.3 k ohms. As will be seen later, the signal to noise ratio can be increased even more than tenfold.

In addition to the noise problem discussed above, the mixer circuit may be required to work with various local oscillator and modulating signal sources whose common-mode voltages take on a range of values within prescribed limits. This factor precludes simply replacing the current source transistors B12 and B13 with resistors to improve the noise, since this would cause the bias current to vary unacceptably with the input common-mode voltage.

Figure 2:
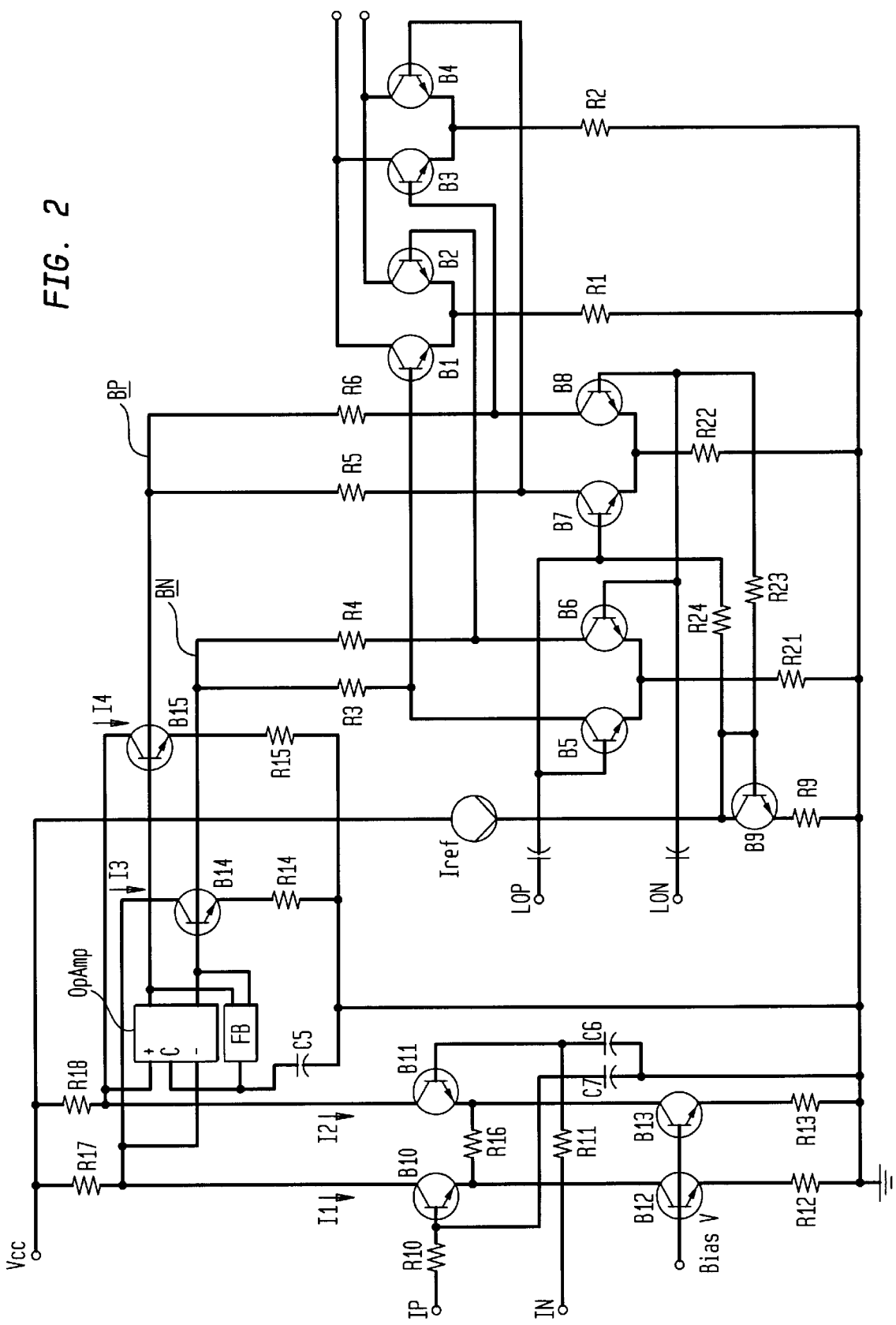
FIG. 2 depicts an illustrative embodiment of a low noise mixer according to the invention.

The circuitry of FIG. 2 is designed to alleviate these problems. For ease of comparison with the functions performed, the circuit elements of FIG. 2 which perform roughly the same functions as those of FIG. 1 have been given the same reference numbers. Thus, in both FIGS. 1 and 2, the four-quadrant mixer transistors are given reference numerals B1–B4. Similarly, two of the local oscillator buffer transistors are labeled B5 and B6 in both FIGS. 1 and 2, while two of the modulating transistors are labeled B11 and B11. However, in FIG. 2, since there are no additional transistors required in their emitter to ground path, mixer transistors B1, B2 now advantageously may tolerate, for the same value of emitter current as the FIG. 1 configuration, a larger valued resistor R1. Similarly, the emitter to ground path of the second pair of common emitter connected mixer transistors B3, B4 now advantageously may includes a larger valued resistor R2, thereby increasing the signal to noise ratio in both resistors R1 and R2.

The circuitry of FIG. 2 also differs from the circuitry of FIG. 1 in that it is desired to drive the bases of transistor pair B1, B2 separately from the drive applied to the bases of transistor pair B3, B4. Separately driving the bases of each pair of mixer transistors B1, B2 and B3, B4 permits the common-mode voltage of each transistor pair to be separately controlled but allows the average of the two common-mode voltages to be fixed, thereby establishing a fixed common-mode biasing current for the two pairs of transistors. More particularly, the voltage $V_{BN}$ that is applied to the bases of transistor pair B1, B2 and the voltage $V_{BP}$ that is applied to bases of transistor pair B3, B4 will be controlled by circuitry hereinafter to be described so that $(V_{BP}+V_{BN})/2$ is set at a common-mode bias level, considering the value of resistors R1, R2, to produce the desired value of emitter bias current. In addition, the "modulating signal" is applied as a common-mode signal to B1 and B2's base, such that the "modulating signal" plus the common-mode bias level sets the current through B1–B2's emitter resistor (R1). The local oscillator signal, however, is applied differentially to the bases of B1 and B2 so, to a first order, it does not affect the current in R1. The local oscillator signal (assuming it completely switches the B1–B2 mixer transistor pair) causes the current in R1 to be directed to either one or the other output depending on the polarity of the local oscillator signal. Accordingly, the output signal from the B1–B2 mixer transistor pair is I(R1)*LO, where the LO is the local oscillator square wave having an amplitude of +/−1 and the current I(R1) is proportional to the "modulating signal".

With the common-mode voltage of each pair of mixer transistors being separately controllable it remains to describe the circuitry that (a) stabilizes the common-mode bias voltage applied to each pair of mixer transistors against variation caused by different modulating signal sources and (b) linearly superimposes the modulating signal voltage upon the local oscillator signal.

The modulating signal source is connected between terminals IP and IN of buffer stage transistors B10, B11. The modulating signal source will have a nominally specified common-mode voltage range as well as a nominally specified range of differential voltage. Typically, this common-mode voltage would be allowed to vary within a range from about 1.35 v to Vcc. The lower voltage extreme is limited by the sum of the Vbe of B10 (about 0.9 V at low temperature), the saturation voltage of B12 (about 100 mV), the voltage drop across R12 (about 100 mV), and a portion of the differential modulating signal amplitude (about 1 V peak-to-peak differential divided by 4).

While the common-mode voltage at the modulator input terminals IN and IP will thus have some variation it is essential that the common-mode bias voltage applied to the bases of mixer transistors B1–B4 be stabilized so that their emitter currents can be specified. This is accomplished by rejecting the common-mode input voltage at IN and IP with the degenerated differential pair B10, B11 and regenerating a new common-mode voltage using the common-mode feedback path of operational amplifier OpAmp and the feedback circuit "FB". Feedback circuit FB, which may simply be comprised of two resistors, senses the voltages at points BP and BN and applies the average to the "C" input terminal of operational amplifier OpAmp, which has an internal reference voltage for the common-mode level. If the voltage on the "C" input of the operational amplifier goes above this reference voltage, the amplifier will force its own common-mode output voltage, which is equal to $(V_{BN}+V_{BP})/2$, down. Conversely, if the voltage on the C input of the operational amplifier goes below the reference voltage, the amplifier will force the common-mode output voltage up. The common-mode voltage at the bases of transistors B1–B4 is approximately equal to the common-mode voltage $(V_{BN}+V_{BP})/2$.

The differential modulating signal voltage between points IN and IP is reproduced between the nodes BN and BP by the differential feedback path of the operational amplifier OpAmp. Operational amplifier OpAmp senses the differential modulating voltage at the collectors of transistors B10 and B11 and applies an amplified differential voltage between points BP and BN so that the collector current I4 minus I3 through transistors B15, B14 is substantially equal to the collector current I1 minus I2. The average current in R1 and R2, $(I_{R1}+I_{R2})/2$, is related to the average current in B14 and B15 by the ratio of the resistors R14/R1. (R14 is assumed to equal R15 and R1 is assumed to equal R2.) The average current in B14 and B15 is (I3+I4)/2 and is set by the difference of the common-mode reference voltage internal to the operational amplifier minus the Vbe of B14 or B15 divided by the resistance of R14. The voltage drop across R3 through R6 can be neglected as long as the LO signal completely switches the differential pairs B5, B6 and B7, B8.

The differential current in RI and R2 $(I_{R1}-I_{R2})$ is related to the differential current in B14 and B15 by the ratio of the resistors R14/R1. The differential current in B14 and B15 is (I4−I3). The operational amplifier force (I4−I3) to equal (I1−I2). The input differential pair 10 and B11, with emitter degeneration resistor R16, produce the relationship $(V_{IP}-V_{IN})/R16=(IR1-I2)$. So the differential current in R1 and R2 is related to the input voltage $(V_{IP}-V_{IN})$ by the relationship:

$(I_{R1}-I_{R2})=(V_{IP}-V_{IN})/R16*R14/R1$.

Holding constant the common-mode bias voltage $(V_{BN}+V_{BP})/2$ that is applied at the bases of transistors B1–B4 has several advantages. First, it allows resistors to be used in the emitter circuits of transistors B1/B2 and B3/B4 to set the current. If the common-mode bias voltage $(V_{BN}+V_{BP})/2$ were not held constant, the current in B1/B2 and B2/B4 would vary unacceptably due to the resistor biasing.

Secondly, it provides maximum head-room (Vce) for the transistors B1/B2 and B3/B4. If the common-mode bias voltage (VBN+VBP)/2 varied directly as the input common-mode voltage, (VIP+VIN)/2 it could, in the extreme case, equal Vcc, thereby reducing the collector to base voltage of B1/B2 and B3/B4 to almost zero. This would unacceptably limit the output power of the mixer.

Figure 3:
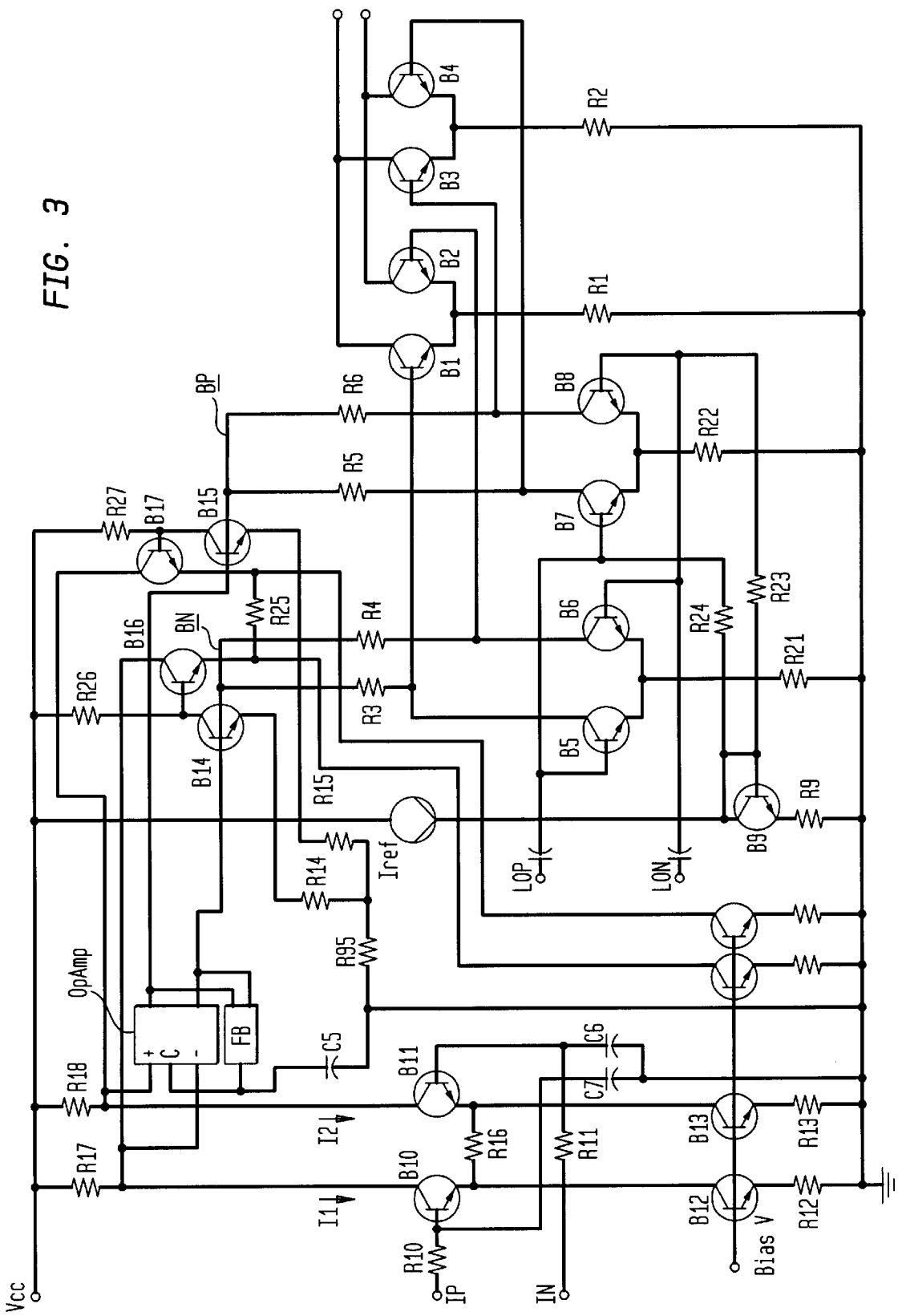
FIG. 3 depicts an improved form of the mixer of FIG. 2.

In FIG. 2 the ratio (VBP−VBN)/(VIP−VIN) is approximately equal to (R14+R15)/R16. In FIG. 3 the ratio is set by R25/R16. The amount of scaling is determined by balancing the requirements for the output head-room requirements (Vce of B1,B2 and of B3,B4) and the amount of local oscillator leakage to the output caused by random offset voltage (due to random mismatches in the transistors and resistors). The smaller one makes the ratio, the more error will be cause by the offset voltage.

The currents I1 and I2 are distorted by the Vbe of B10 and B11. This is especially true as the input voltage (VIP−VIN) approaches (I1)*R16. In FIG. 3 additional circuitry including transistors B16, B17 and resistor R25 are added to duplicate this input distortion. With the added circuitry, the differential voltage produced at the bases of transistors B16 and B17 should be exactly what is seen at the bases of transistors B10 and B11, forcing the current $I_{R14}-I_{R15}$ to be linearly dependent upon the input voltage. Without the extra circuitry, the current $I_{R14}-I_{R15}$ would be proportional to the voltage across R16—which is a slightly distorted version of the input voltage. may be noted that the voltage across the bases of transistors B14 and B15 may be somewhat distorted because of the variation of Vbe with the signal. This distortion is intended to mimic what happens in transistors B1,B2 and B3, B4 so that the current $I_{R1}-I_{R2}$ will be linearly dependent on the current $I_{R14}-I_{R15}$ Ideally, the voltage drop (with no signal) across resistor R14 would equal the voltage drop across resistor R1 and the voltage drop across resistor R15 would equal the drop across R2. In FIG. 3, resistor R95 has been added so that its voltage drop should equal the voltage drop across the resistors R3, R4 and R5, R6, which may be present in the event that B5, B6 and B7, B8 are not completely switched by the LO signal.

With the common-mode voltage applied to mixer transistors B1–B4 controlled, it remains to control the common-mode voltage applied to the bases of local oscillator buffer transistors B5–B8. This is accomplished by the circuitry which includes the current reference source Iref, resistor R24 and resistor R23 and diode-connected transistor B9. This circuitry sets the common-mode voltage applied to the bases of transistors B5–B8 at about 1.2 v above ground. Capacitors C1 and C2 then ac-couple the local oscillator input to the bases of transistors B5–B8.

What has been described is deemed to be illustrative of the principles of our invention. It was mentioned above that the signal to noise ratio can be still further increased. For example, if in FIG. 2, the voltage across R1 were set to about 0.4 Volts and the value of R1 were set to 100 Ohms, an emitter current of about 4 mA would result, giving rise to a maximum signal to noise ratio of about 10*log10{[(0.4 v/(sqrt(2)))^2]/(4 kT*100)}=166.8 dB/Hz . The prior art circuit of FIG. 1 would have a signal to noise ratio of 10*log10[(0.1 v/(sqrt(2))) ^2]/ (4kT*330)}=149.6 dB/Hz, if the voltage across R12 were set to 0.1 volts and the value of R12 were set to 330 ohms. So, in the circuits of FIGS. 2 and 3 the resistor noise contribution is lower by a factor of about 53 times (53=10^[(166.8−149.6)/10] ). It should also be understood that transistor B14 may be replaced by a pair of transistors ("B14A" and "B 14B") to separately sense the collector voltages of transistor pair B5, B6 and more accurately reproduce the current in R1 by mimicking the operation of B1 and B2. Likewise, transistor B15 may be replaced by a pair transistors ("B15A", "B15B") to separately sense the collector voltages of transistor pair B7, B8. In addition, it should be appreciated that while the illustrative embodiment has been explained in terms of bipolar transistors, it will be apparent that the discrete transistors may be replaced by an integrated circuit using unipolar transistors. In an integrated circuit embodiment, the term emitter will be replaced by the term "source" the term base will be replaced by the term "gate", and the term collector will be replaced by the term "drain" in the foregoing description. Numerous other modifications may be made by those skilled in the art without, however, departing from the spirit and scope of the invention.

What is claimed is:

1. A mixer for superimposing a common-mode stabilized modulating signal on a local oscillator signal, comprising:
    a modulating input;
    a first circuit (Op Amp) for deriving a modulating signal free of said common mode voltage;
    two pairs of common-emitter connected mixer transistors (B1–B4), the transistor pairs having respective common emitter biasing impedances;
    two pairs of summing impedances (R3–R6); and
    a second circuit (B14, B15) for applying through said summing impedances to each pair of said common-emitter connected mixer transistor bases said modulating signal; a differential local oscillator voltage and a controlled common-mode bias voltage to establish a common-mode bias current in said biasing impedances.

2. A mixer having at least two pairs of differentially connected mixer transistors for mixing a local oscillator voltage (LO) with a source of modulating signal (IP, IN) having a nominally specified common-mode voltage, comprising:
    at least two pair of summing impedances;
    a first circuit for coupling said local oscillator signal to said summing impedances;
    a second circuit for coupling said modulating signal to said summing impedances having a stabilized common-mode voltage; and
    a connection path for separately coupling signals from said summing impedances to the bases of said differentially connected mixer transistors.

3. A mixer according to claim 2 wherein said mixer is a four-quadrant mixer having a first and a second pair of mixer transistors and a third and a fourth pair of input buffer transistors.

4. A mixer according to claim 3, wherein said second circuit comprises:
    an operational amplifier for reproducing said modulating signal from said source at the bases of a first and second transistor (B14, B15); and
    a feedback network (FB) for applying to a terminal (C) of said operational amplifier a common-mode voltage from said bases of said third and fourth transistors.

5. A mixer according to claim 4, wherein the base of said first transistor (B14) is coupled to the bases of a first of said pair of mixer transistors; wherein the collector current of said first transistor is controlled by one output terminal of said operational amplifier; wherein the base of said second transistor (B15) is coupled to the bases of a second of said pair of mixer transistors and wherein the collector current of said second transistor is controlled by another output terminal of said operational amplifier.

6. A mixer according to claim 5, further including:

an additional transistor (B16) for sensing the collector voltage of said first transistor;

a further transistor (B17) for sensing the collector voltage of said second transistor; the collector voltages of said additional and said further transistors modifying the voltages at respective input terminals of said operational amplifier.

7. A mixer according to claim 6, further comprising a transistor input buffer (B10, B11) connected between said modulating signal source and said input terminals of said operational amplifier, said additional and said further transistors being adapted to draw current through the collector resistors (R17, R18) of said transistor input buffer.

8. An integrated circuit including a mixer having at least two pairs of semiconductor devices sharing a common electrode, each semiconductor device having a main conduction path which includes said common electrode and a separate control electrode, comprising:

a first circuit for separately and differentially driving the semiconductor control electrodes with a carrier signal (LOP, LON) superimposed upon a modulating signal (IP, IN);

means (OpAmp, FB, B14, B15) for stabilizing the common mode voltage; and a second circuit for applying a predetermined common-mode voltage to the control electrodes to establish a desired value of current through said main conduction path.

9. A method of increasing the signal to noise ratio of a differential transistor mixer circuit for mixing a differential local oscillator voltage with a modulating voltage having an indeterminate common-mode voltage, said transistor mixer circuit having at least two pairs of transistor a biasing impedance in series with the emitters of said transistor mixer circuit comprising the steps of a) stabilizing the common-mode voltage applied to the differential transistor circuit to establish a desired value of current in the common emitter biasing impedance that is independent of the common-mode voltage of the modulating signal source to produce a clean modulating signal;

b) superimposing said local oscillator voltage upon said clean modulating signal at the bases of said differential transistor mixer circuit to separately and differentially drive said bases with said local oscillator voltage and to drive said bases in common with said clean modulating signal; and c) applying a predetermined quiescent common-mode voltage to the bases of the transistor circuit to establish a desired value of current through said biasing impedance.

10. A method of increasing the signal to noise ratio of at least two pairs of transition mixer circuit for mixing a local oscillator voltage (LOP, LON) with a modulating voltage (IP, IN) that may exhibit an indeterminate common-mode voltage, said transistor mixer circuit having a biasing impedance in series with the emitters of said transistor mixer circuit, comprising the steps of:

feeding back a portion (FB) of the modulator voltage through an operational amplifier (OpAmp) to derive a common-mode stabilized modulating signal (BN, BP);

driving the bases of the transistor mixer circuit (B1–B4), differentially with said local oscillator voltage and in common with said modulating signal; and applying a predetermined common-mode voltage to the bases of the transistor circuit to establish a desired value of quiescent current through said biasing impedance.

* * * * *